(12) United States Patent
Dwilinski et al.

(10) Patent No.: US 7,422,633 B2
(45) Date of Patent: *Sep. 9, 2008

(54) METHOD OF FORMING GALLIUM-CONTAINING NITRIDE BULK SINGLE CRYSTAL ON HETEROGENEOUS SUBSTRATE

(75) Inventors: Robert Dwilinski, Warsaw (PL); Roman Doradzinski, Warsaw (PL); Jerzy Garczynski, Lomianki (PL); Leszek Sierzputowski, Union, NJ (US); Yasuo Kanbara, Anan (JP)

(73) Assignees: Ammono SP. ZO. O., Warsaw (PL); Nichia Corporation, Anan-shi, Tokushima (JP)

( * ) Notice: Subject to any disclaimer, the term of this patent is extended or adjusted under 35 U.S.C. 154(b) by 318 days.

This patent is subject to a terminal disclaimer.

(21) Appl. No.: 10/479,857

(22) PCT Filed: Jun. 6, 2002

(86) PCT No.: PCT/JP02/05626

§ 371 (c)(1), (2), (4) Date: Jun. 9, 2004

(87) PCT Pub. No.: WO02/101126

PCT Pub. Date: Dec. 19, 2002

(65) Prior Publication Data

US 2004/0255840 A1    Dec. 23, 2004

(30) Foreign Application Priority Data

Jun. 6, 2001    (PL) .................................... 347918
Oct. 26, 2001    (PL) .................................... 350375

(51) Int. Cl.
*C30B 9/00*    (2006.01)

(52) U.S. Cl. ................ 117/68; 117/69; 117/70; 117/77; 117/78; 117/73; 117/74; 117/76; 117/952

(58) Field of Classification Search ............ 117/68, 117/3, 75, 81, 83, 952, 69, 70, 73, 74, 76, 117/77
See application file for complete search history.

(56) References Cited

U.S. PATENT DOCUMENTS 5,096,860 A    3/1992 Nadkarni
(Continued)

FOREIGN PATENT DOCUMENTS

CN    1036414    10/1989
(Continued)

OTHER PUBLICATIONS

R. Dwilinski et al., Ammono method of GaN and AlN production, May 18, 1998, pp. 1348-1350.
(Continued)

*Primary Examiner*—Robert Kunemund
*Assistant Examiner*—Matthew Song
(74) *Attorney, Agent, or Firm*—Morrison & Foerster, LLP

(57) ABSTRACT

The present invention provides a process for forming a bulk monocrystalline gallium-containing nitride, i.e. GaN etc., on the surface of heterogeneous substrate, i.e. SiC etc., comprising the steps of forming a supercritical ammonia solvent containing ion or ions of alkali metals in an autoclave, dissolving a gallium-containing feedstock in the supercritical ammonia solvent to form a supercritical solution in which the feedstock is dissolved, and crystallizing gallium-containing nitride on the face of a seed which contains no element of oxygen and has a lattice constant of 2.8 to 3.6 with respect to $a_o$-axis from the supercritical solution, under a condition of a higher temperature and/or a lower pressure than the temperature and/or the pressure where the gallium-containing feedstock is dissolved in the supercritical solvent. Therefore nitride gallium system compound semiconductor device can be formed on a conductive substrate.

19 Claims, 9 Drawing Sheets

U.S. PATENT DOCUMENTS

| | | | |
|---|---|---|---|
| 5,456,204 A | 10/1995 | Dimitrov et al. | |
| 5,589,153 A | 12/1996 | Garces | |
| 5,679,965 A | 10/1997 | Schetzina | |
| 5,780,876 A | 7/1998 | Hata | |
| 5,868,837 A | 2/1999 | DiSalvo et al. | |
| 5,928,421 A | 7/1999 | Yuri et al. | |
| 6,031,858 A | 2/2000 | Hatakoshi et al. | |
| 6,046,464 A | 4/2000 | Schetzina | |
| 6,051,145 A | 4/2000 | Griffith et al. | |
| 6,067,310 A | 5/2000 | Hashimoto et al. | |
| 6,139,628 A * | 10/2000 | Yuri et al. | 117/89 |
| 6,156,581 A | 12/2000 | Vaudo et al. | |
| 6,172,382 B1 | 1/2001 | Nagahama | |
| 6,177,057 B1 | 1/2001 | Purdy | |
| 6,252,261 B1 | 6/2001 | Usui | |
| 6,265,322 B1 | 7/2001 | Anselm et al. | |
| 6,270,569 B1 * | 8/2001 | Shibata et al. | 117/68 |
| 6,303,403 B1 | 10/2001 | Sato et al. | |
| 6,329,215 B1 | 12/2001 | Porowski et al. | |
| 6,372,041 B1 | 4/2002 | Cho et al. | |
| 6,399,500 B1 | 6/2002 | Porowski et al. | |
| 6,399,966 B1 | 6/2002 | Tsuda | |
| 6,423,984 B1 | 7/2002 | Kato | |
| 6,447,604 B1 | 9/2002 | Flynn et al. | |
| 6,459,712 B2 | 10/2002 | Tanaka et al. | |
| 6,468,882 B2 | 10/2002 | Motoki | |
| 6,488,767 B1 | 12/2002 | Xu et al. | |
| 6,509,651 B1 | 1/2003 | Matsubara | |
| 6,531,072 B1 | 3/2003 | Suda et al. | |
| 6,534,795 B2 | 3/2003 | Hori et al. | |
| 6,586,762 B2 | 7/2003 | Kozaki | |
| 6,593,589 B1 | 7/2003 | Osinski et al. | |
| 6,614,824 B2 | 9/2003 | Tsuda | |
| 6,677,619 B1 | 1/2004 | Nagahama et al. | |
| 6,686,608 B1 | 2/2004 | Takahira | |
| 6,711,191 B1 | 3/2004 | Kozaki | |
| 6,720,586 B1 | 4/2004 | Kidoguchi | |
| 6,858,882 B2 | 2/2005 | Tsuda | |
| 6,924,512 B2 | 8/2005 | Tsuda | |
| 7,053,413 B2 | 5/2006 | D'Evelyn et al. | |
| 7,057,211 B2 | 6/2006 | Dwilinski et al. | |
| 7,081,162 B2 * | 7/2006 | Dwilinski et al. | 117/68 |
| 7,097,707 B2 | 8/2006 | Xu | |
| 7,160,388 B2 * | 1/2007 | Dwili ski et al. | 117/68 |
| 7,291,544 B2 | 11/2007 | D'Evelyn et al. | |
| 2001/0008656 A1 | 7/2001 | Tischler et al. | |
| 2001/0022154 A1 | 9/2001 | Cho et al. | |
| 2001/0030328 A1 | 10/2001 | Ishida | |
| 2002/0014631 A1 | 2/2002 | Iwata | |
| 2002/0031153 A1 | 3/2002 | Niwa | |
| 2002/0047113 A1 | 4/2002 | Ohno | |
| 2002/0063258 A1 | 5/2002 | Motoki | |
| 2002/0078881 A1 | 6/2002 | Cuomo | |
| 2002/0189531 A1 * | 12/2002 | Dwilinski et al. | 117/81 |
| 2003/0143771 A1 | 7/2003 | Kidoguchi et al. | |
| 2003/0209191 A1 | 11/2003 | Purdy | |
| 2004/0031978 A1 | 2/2004 | D'Evelyn et al. | |
| 2004/0139912 A1 * | 7/2004 | Dwilinski et al. | 117/73 |
| 2004/0244680 A1 | 12/2004 | Dwilinski et al. | |
| 2004/0255840 A1 * | 12/2004 | Dwilinski et al. | 117/2 |
| 2006/0032428 A1 * | 2/2006 | Dwilinski et al. | 117/11 |
| 2006/0037530 A1 * | 2/2006 | Dwilinski et al. | 117/70 |

FOREIGN PATENT DOCUMENTS

| | | |
|---|---|---|
| CN | 1289867 A | 4/2001 |
| CN | 1065289 C | 5/2001 |
| EP | 0 711 853 B1 | 5/1996 |
| EP | 0 716 457 A2 | 6/1996 |
| EP | 0 949 731 | 10/1999 |
| EP | 0973207 A2 | 1/2000 |
| EP | 1088914 A1 | 4/2001 |
| FR | 2 796 657 | 1/2001 |
| GB | 2 326 160 | 12/1998 |
| GB | 2 333 521 | 7/1999 |
| JP | 07-022692 B2 | 3/1995 |
| JP | 7-165498 | 6/1995 |
| JP | 7-249830 | 9/1995 |
| JP | 8-250802 | 9/1996 |
| JP | 9-134878 | 5/1997 |
| JP | 09-293897 | 11/1997 |
| JP | 10-7496 | 1/1998 |
| JP | 10-70079 | 3/1998 |
| JP | 10-70338 | 3/1998 |
| JP | 10-84161 A | 3/1998 |
| JP | 11-54847 | 2/1999 |
| JP | 11-307813 | 11/1999 |
| JP | 2000-82863 | 3/2000 |
| JP | 2000-82867 A | 3/2000 |
| JP | 2000-216494 | 8/2000 |
| JP | 2000-327495 | 11/2000 |
| JP | 2001-85737 | 3/2001 |
| JP | 2001-342100 | 12/2001 |
| JP | 2003040699 A | 2/2003 |
| JP | 2004168656 A | 6/2004 |
| WO | WO 98/55671 | 12/1998 |
| WO | WO 01/24284 | 4/2001 |
| WO | WO 01/24921 A1 | 4/2001 |
| WO | WO-02101120 A2 | 12/2002 |

OTHER PUBLICATIONS

Hisanori Yamane, Polarity of GaN Single Crystals Prepared with Na Flux, pp. 3436-3440.

Masichi Yano et al., Control of Nucleation Site and Growth Orientation of Bulk GaN Crystals.

R. Dwilinski et al., Ammo method of BN, AlN and GaN synthesis and crystal growth, pp. 1-4.

K. Pakula et al., Growth of GaN Metalorganic Chemical Vapour Deposition Layers on GaN Single Crystals, vol. 88 (1995), pp. 861-864.

R. Dwilinski et al., On GaN Crystallization by Ammonothermal Method, vol. 90(1996, pp. 763-766.

R. Dwilinski et al., Exciton plhoto-liminescence of GaN bulk crystals grown by the Ammono method, (1997), pp. 46-49.

Douglas R. Ketchum et al., Crystal growth of gallium nitride in supercritical ammonia, (2001) pp. 431-434.

Yu Melnik et al., Properties of free-standing gan bulk crystals grown by hvpe, 1998, pp. 269-274.

C.M. Balkas et al., Growth of Bulk AlN and GaN Single Crystals by Sublimation, vol. 449 1997, pp. 41-46.

Sylwester Porowski, Bulk and homoepitaxial GaN-growth and characterisation, 1998, pp. 153-158.

Masato Aoki et al. Growth of GaN single crystals from a Na-Ga melt at 750 degreesC. and 5Mpa of N2, 2000, pp. 7-12.

D. Ketchum, et al., "Crystal growth of gallium nitride in supercritical ammonia", *Journal of Crystal Growth*, vol. 222, Jul. 18, 2000.

R. Dwilinski, et al., "Ammono method of GaN and AlN production", *Diamond and Related Materials*, vol. 7, May 18, 1998.

Yamane, Hisanori et al. (1998) "Morphology and Characterization of GaN Single Crystals Grown in a Na Flux," Journal of Crystal Growth 186, pp. 8-12.

Yamane, Hisanori et al. (1998) "Na Flux Growth of GaN Single Crystals," Journal of the Japanese Association for Crystal Growth 25(4), pp. 14-18, with partial English translation.

Waltereit, P. et al. (2000) "Nitride Semiconductors Free of Electrostatic Fields for Efficient White Light-Emitting Diodes," *Nature* 406, pp. 865-868.

Brandt, O. et al. (1999) "Critical Issues for the Growth of High-Quality (Al,Ga) N/GaN and GaN/(In,Ga)N Heterostructures on SiC(0001) by Molecular-Beam Epitaxy," Applied Physics Letters 75(25), pp. 4019-4021.

Notification from Japanese Patent Office mailed Mar. 14, 2006, directed to JP Application No. 2003-503867, with partial English translation.

Chinese Office Action mailed Mar. 3, 2006, directed to corresponding CN Application No. 02821230.4.

Office Action mailed Mar. 24, 2006, directed to related U.S. Appl. No. 10/493,594.

Office Action mailed Apr. 20, 2006, directed to related U.S. Appl. No. 10/493,747.

Akasaki, I. et al. (1991). "Growth and Properties of Single Crystalline GaN Films by Hydride Vapor Phase Epitaxy," *Crystal Properties and Preparation* 32-34:154-157.

Chu, T. L. et al. (1974). "Crystal Growth and Characterization of Gallium Nitride," *J. Electrochem. Soc.*: Solid-State Science and Technology 121-1:159-162.

Kaschner, A. et al. (1999). "Influence of Doping on the Lattice Dynamics of Gallium Nitride," *MRS Internet J. Nitride Semicond. Res.* 4S1, G3.57.

Kim, S. T. et al. (1998). "Preparation and Properties of Free-standing HVPE Grown GaN Substrates," *Journal of Crystal Growth* 194:37-42.

Kuroda, Naotaka et al. (1998). "Precise Control of Pn-junction Profiles for GaN-based LD structures Using GaN Substrates with Low Dislocation Densities," *Journal of Crystal Growth* 189/190:551-555.

Motoki, Kensaku et al. (2001). "Preparation of Large Freestanding GaN Substrates by Hydride Vapor Phase Epitaxy Using GaAs as a Starting Substrate," *J. Appl. Phys.* 40:L140-L143.

Chinese Office Action dated Aug. 5, 2005, directed to corresponding Chinese application 02821231.2.

U.S. Office Action dated April 20, 2005, directed to corresponding U.S Appl. No. 10/479,807.

U.S. Office Action dated Aug. 2, 2005, directed to corresponding U.S. Appl. No. 10/493,594.

International Search Report mailed Feb. 18, 2003, directed to corresponding international application.

S. Porowski et al. (1993) "Prospects for High-Pressure Crystal Growth of III-V Nitrides," Inst. Phys. Conf. Ser. No. 137; Chapter 4, pp. 369-372.

Akito Kurarmata et al. (1996) "Substrates for III-V Nitride Semiconductors," *Oyo Buturi* 65(9), pp. 936-940.

Chinese Office Action dated Apr. 8, 2005.

Shin-ichi Hirano et al. (1989) "Hydrothermal Synthesis of Gallium Orthophosphate Crystals," Bull. Chem. Soc. Jpn. 62, pp. 275-278.

(1997). "Single Crystal Growth," Chapter 1 *In* Hydrothermal Synthesis Handbook. Gihodo Press, Second Edition, pp. 245-255.

R. A. Laudise (1991). "What is Materials Chemistry?" Chapter 27 *In* Materials for NonLinear Optics: Chemical Perspectives. American Chemical Society. pp. 410-433.

Noboru Sakagami et al. (1974) "Growth Kinetics and Morphology of ZnO Single Crystal Grown under Hydrothermal Conditions," *Journal of the Ceramic Association* 82, pp. 405-413.

T. Sekiguchi et al. (2000) "Hydrothermal Growth of ZnO Single Crystals and their Optical Characterization," *Journal of Crystal Growth* 214/215, pp. 72-76.

K. Yanagisawa et al. (1996) "Hydrothermal Single Growth of Calcite in Ammonium Acetate Solution," *Journal of Crystal Growth* 163, pp. 285-294.

K. Yanagisawa et al. (2001) "Improvement of Quality of Hydrothermally Grown Calcite Single Crystals," *Journal of Crystal Growth* 229, pp. 440-444.

S. Hirano (1991) "Growth of Gallium Orhophosphate Single Crystals in Acidic Hydrothermal Solutions," *Journal of Materials Science* 24, pp. 2805-2808.

Notification from Japanese Patent Office dated Mar. 29, 2005 and Submission of Printed Publication.

Mao et al., *New Technology Pressure-Variation Liquid Phase Epitaxy*, SPIE Photonics Taiwan Conference Proceeding, Jul. 2000, pp. 1-12.

M. Palczewska et al. (1998). "Paramagnetic Defects in GaN," MRS Internet J. Nitride Semicond. Res. 3, 45.

*Preliminary Notice of Rejection of the IPO* (Translation), 3 pages.

Journal of Physics Condensed Matter, v13, n32 Aug. 13, 2001, pp. 6875-6892.

Physica Status Solidi (a) Applied Research, v180, n1, 2000, pp. 51-58.

U.S. Office Action dated Nov. 14, 2006, directed to counterpart U.S. Appl. No. 10/682,891.

Japanese Office Action dated Dec. 26, 2006, directed to counterpart JP application No. 2003-544869.

European Search Report dated Aug. 22, 2007, directed to counterpart EP application No. 02775396.1 (3 pages).

Porowski, S. (1996). "High pressure growth of GaN—new prospects for blue lasers," *Journal of Crystal Growth* 166:583-589.

Chinese Office Action dated Apr. 13, 2007, directed to counterpart CN application No. 02802023.

Polish Patent Office Notification dated Jan. 15, 2007, directed at corresponding Polish Application No. P-347918.

Polish Search Report dated Jan. 15, 2007, directed at corresponding Polish Application No. P-347918.

Penkala, Tadeusz. (1972). *Zarys krystalografii (Basics of Crystallography)*. PWN, ed., Warszawa: 349 and verified English translation.

N. IO. Ikornikova. (1975). *Hydrothermal synthesis of crystals in chloride systems*, Izd. Nauka, ed. Moscow: 124-125; 132-133 and verified English translation.

Peters, D. (1990). "Ammonothermal Synthesis of Aluminium Nitride," *Journal of Crystal Growth* 104:411-418.

Sangwal, Keshra, ed. (1994). "Growth apparatus" Chapter 10.3 *In Elementary Crystal Growth*. Lublin: 331.

Purdy, Andrew P. (1999). "Ammonothermal Synthesis of Cubic Gallium Nitride," *Chem. Mater.* 11:1648-1651.

Lan et al. (2000). "Syntheses and structure of nanocrystalline gallium nitride obtained from ammonothermal method using lithium metal as mineralizator," *Materials Research Bulletin* 35:2325-2330.

U.S. Office Action, mailed Apr. 15, 2008, directed to related U.S. Appl. No. 10/493,594. 27 pages.

M. Fukuda (1998) "Optical Demiconductor Devices:" *Wiley Series in Microwave and Optical Engineering*. Chang, K., John Wiley & Sons, Inc. New York.Esp. especially page 7.

Sze, S.M. (1998). *Modern Semiconductor Device Physics*. John Wiley & Sons, Inc. New York. Esp. Appendix G(pp. 539-540).

U.S. Office Action, mailed Jun. 10, 2008, directed to related U.S. Appl. No. 10/514,429. 60 pages.

* cited by examiner

US 7,422,633 B2

METHOD OF FORMING GALLIUM-CONTAINING NITRIDE BULK SINGLE CRYSTAL ON HETEROGENEOUS SUBSTRATE

TECHNICAL FIELD

The present invention relates to a process of growing a bulk monocrystalline gallium-containing nitride on heterogeneous substrate by crystallizing from a supercritical solution on a seed (heterogeneous substrate).

BACKGROUND ART

Known nitride-applied optic and electronic devices are manufactured on sapphire or silicon-carbide substrates, differing from the deposited nitride layers (i.e. heteroepitaxy). In the most commonly used MOCVD method GaN is grown by a vapor phase epitaxy from ammonia and metallo-organic compounds, but it is impossible to get a bulk monocrystalline. In the present situation, by using a buffer layer the number of dislocation per unit area can be reduced, however the reduction of surface dislocation density achieved is up to about $10^8/cm^2$.

Recently, the dislocation density can be decreased by using the Epitaxial Lateral Overgrowth (ELOG) method. In this method, a GaN layer is first grown on the sapphire substrate, and then $SiO_2$ is deposited in the form of strips or grids. Next, such a substrate may be used for ELOG of GaN, thereby reducing the dislocation density below about $10^7/cm^2$. However, this method has a difficulty in reducing the dislocation density $10^6/cm^2$ or less.

In the HNP method ["Prospects for high-pressure crystal growth of III-V nitrides" S. Porowski et al., Inst. Phys. Conf. Series, 137, 369 (1998)] growth of crystals is carried out in melted gallium, i.e. in the liquid phase, however resulting in production of GaN crystal about 10 mm in size. Sufficient solubility of nitrogen in gallium requires temperatures of about 1500° C. and nitrogen pressures of the order of 15 kbar. In another known method, supercritical ammonia was proposed to lower the temperature and decrease the pressure during the growth process. ["ammono method of BN, AlN, and GaN synthesis and crystal growth" R. Dwilinski et al., Proc. EGW-3, Warsaw, Jun. 22-24, 1998, MRS Internet Journal of Nitride Semiconductor Research] ["Crystal Growth of gallium nitride in supercritical ammonia", J. W. Kolis et al., J. Cryst. Growth 222, 431-434 (2001)]. However, only GaN crystal having about 0.5 mm length and no bulk monocrystalline was obtained, therefore such GaN crystal cannot be used as a substrate of electrical devices etc.

DISCLOSURE OF INVENTION (Problems to be Solved by the Invention)

By making use of chemical transport in a supercritical ammonia solvent containing at least one mineralizer for imparting an ammono-basic property, the inventors of the present invention reached to provide a process for obtaining the growth of monocrystalline gallium-containing nitride. However, GaN layer having a dislocation density of $10^6/cm^2$ or less leads to a decrease of conductive function, so that the GaN substrate is not preferable to be used for electrical devices.

A first object of the present invention is, therefore, to provide a process for forming a bulk monocrystalline gallium-containing nitride on a heterogeneous substrate seed provided with function of conductivity or the like. Another object of the present invention is to provide a bulk crystalline nitride as a substrate for optical devices having a good quality.

(Means for Solving the Problems)

The first invention for achieving the above objects is based on a process, wherein in a supercritical ammonia solvent containing at least one mineralizer for imparting an ammono-basic property, the seed comprising no element of oxygen and having a lattice constant of 2.8 to 3.6 with respect to $a_o$-axis has difficulty in being dissolved, so that a chemical transport of gallium-containing nitride is used for the growth of monocrystalline gallium-containing nitride. Further, the growth thereof at relatively low temperature leads to the decrease of thermal expansion even if the conductive substrate such as metal is used as the seed, so that crystal can be grown without any hindrance. That is, according to the first invention, there is provided a process for forming a bulk monocrystalline gallium-containing nitride, comprising the steps of dissolving gallium-containing feedstock in a supercritical solvent containing ammonia and alkali metal ion or ions in an autoclave, so as to form a supercritical solution containing gallium-containing nitride whose solubility has a negative temperature coefficient; and selectively crystallizing gallium-containing nitride crystal only on the face of a seed having a lattice constant of 2.8 to 3.6 with respect to $a_o$-axis arranged in the autoclave, from the above supercritical solution introduced, by taking advantage of the negative temperature coefficient of the solubility of gallium-containing nitride.

According to the present invention, there is provided a process for forming a bulk monocrystalline gallium-containing nitride, comprising the steps of dissolving gallium-containing feedstock in a supercritical solvent containing ammonia and alkali metal ion or ions in an autoclave, so as to form a supercritical solution containing gallium-containing nitride whose solubility has a positive pressure coefficient; and selectively crystallizing gallium-containing nitride crystal only on the face of a seed having a lattice constant of 2.8 to 3.6 with respect to $a_o$-axis arranged in the autoclave, from the above supercritical solution introduced, by taking advantage of the positive pressure coefficient of the solubility of gallium-containing nitride.

(The Advantageous Effect than Prior Arts)

According to this invention, the seed contains no element of oxygen, therefore, it is advantageous to have difficulty in being dissolved in a supercritical ammonia solvent, and moreover said seed having a lattice constant of 2.8 to 3.6 with respect to $a_o$-axis leads to a growth of GaN system gallium-containing nitride (a lattice constant 3.16) without any problem. Furthermore, in the recrystallizing method of gallium-containing nitride in supercritical ammonia, the crystal growth at relatively low temperature leads to the decrease of thermal expansion even with the use of conductive substrate such as metals as a crystallizing seed, and crystals can be grown without any hindrance.

Said seed has at least one layer containing at least one element or compound selected from Mo and W of body-centered cubic structure, α-Hf and α-Zr of hexagonal closest packing structure, diamond of tetragonal structure, WC and $W_2C$ of WC structure, SiC, especially α-SiC, TaN, NbN and AlN of ZnO structure, $AgB_2$, $AuB_2$ and $HfB_2$ of hexagonal structure (P6/mmm), and γ-MoC and ε-MbN of hexagonal structure ($P6_3$/mmc) on the surface thereof, or all of the seed can be formed by above elements.

In the first invention, it is essential that the second step of crystallization should be carried out selectively on the face of the seed. Therefore, according to the second aspect of the present invention there is provided a process for crystallizing a bulk monocrystalline gallium-containing nitride, characterized in 1) that a bulk monocrystalline gallium-containing nitride is dissolved in the supercritical solvent containing ammonia and alkali metal ion or ions, so as to form a supercritical solution of gallium-containing nitride whose solubility has a negative temperature coefficient; 2) that the supercritical solution is adjusted below a certain concentration which does not allow spontaneous crystallization, while maintaining the oversaturation of the supercritical solution relative to a seed, by raising the temperature to a predetermined temperature or reducing the pressure to a predetermined pressure, at least in a zone where the seed is arranged; and 3) that gallium-containing nitride is crystallized and selectively grown only on the face of the seed having a lattice constant of 2.8 to 3.6 with respect to $a_o$-axis arranged in the autoclave.

In the second invention, it is preferable that, in case where two zones, i.e., the dissolution zone and the crystallization zone are simultaneously formed in the autoclave, over-saturation of the supercritical solution relative to the seed is maintained by controlling the dissolution temperature and the crystallization temperature. The control is found to be easy by setting the temperature of the crystallization zone at a temperature of 400 to 600° C., and by maintaining the difference in temperature between the dissolution zone and the crystallization zone within the autoclave, to 150° C. or less, preferably 100° C. or less. Preferably, the adjustment of the oversaturation of the supercritical solution relative to the seed is made by providing at least one baffle for dividing the internal of the autoclave into a lower temperature dissolution zone and a higher temperature crystallization zone and controlling the convection amounts of the dissolution zone and the crystallization zone. Further, in case where two zones, i.e., a dissolution zone and a crystallization zone (between which a specified temperature difference is set) are formed in the autoclave, the oversaturation of the supercritical solution relative to the seed is preferably adjusted by using a gallium-containing feedstock composed of a GaN crystal having a total surface area larger than the total surface area of the seed.

In the first invention, the above alkali metal ion or ions are added in the form of an alkali metal or a mineralizer containing no halogen, and the alkali metal ion or ions are of at least one selected from the group consisting of $Li^+$, $Na^+$ and $K^+$. The gallium-containing feedstock to be dissolved in the supercritical solvent is preferably gallium-containing nitride, or otherwise, it may be a gallium precursor which can produce a gallium compound soluble in the supercritical solution.

The process of the present invention is based on an ammono-basic reaction. The gallium-containing feedstock may be either GaN formed by HVPE or GaN formed by chemical reactions, which originally contains, for example, chlorine, in so far as the ammono-basic supercritical reaction is not hindered.

In case of using the second invention, a combination of gallium-containing nitride which is dissolved in an equilibrium reaction to the supercritical ammonia solvent and metallic gallium which irreversibly reacts with the supercritical ammonia solvent can be used as a feedstock.

The control of the reaction for crystallization becomes easy by making use of gallium nitride as gallium-containing nitride. In this case, SiC monocrystalline is preferably used as a seed.

The present invention provides a fourth preferred embodiment as a process for carrying out the first dissolving process and the second crystallizing process concurrently and separately in the autoclave. That is, a process for forming a bulk monocrystalline gallium-containing nitride, comprising the steps of forming a supercritical ammonia solvent containing ion or ions of alkali metals in an autoclave; dissolving a gallium-containing feedstock in the supercritical ammonia solvent to form a supercritical solution in which the feedstock is dissolved; and crystallizing gallium-containing nitride on the face of a seed having a lattice constant of 2.8 to 3.6 with respect to $a_o$-axis from the supercritical solution, under a condition of a higher temperature and/or a lower pressure than the temperature and/or the pressure where the gallium-containing feedstock is dissolved in the supercritical solvent.

In the first invention, it is preferable that, separately from the step of dissolving the gallium-containing nitride, a step of transferring the supercritical solution to a higher temperature and/or a lower pressure zone is provided. At least two zones between which a temperature difference arises are simultaneously formed in the autoclave, and gallium-containing feedstock is located in the lower temperature dissolution zone, and the seed having a lattice constant of 2.8 to 3.6 with respect to $a_o$-axis is located in the higher temperature crystallization zone. It is necessary that the difference in temperature between the dissolution zone and the crystallization zone should be set within such a range that a chemical transport in the supercritical solution can be ensured and can be carried out mainly by convection. The difference in temperature therebetween is generally 1° C. or more, preferably 5 to 150° C., more preferably 100° or less.

In the present invention, gallium-containing nitride is defined as below and as the general formula $Al_xGa_{1-x-y}In_yN$, where $0 \leq x < 1$, $0 \leq y < 1$, and $0 \leq x+y < 1$, and may contain a donor, an acceptor, or a magnetic dopant, as required. As will be defined later, the supercritical solvent contains $NH_3$ and/or a derivative thereof. The mineralizer contains alkali metal ions, at least, ions of sodium or potassium. On the other hand, the gallium-containing feedstock is mainly composed of gallium-containing nitride or a precursor thereof. The precursor is selected from an azide, imide, amidoimide, amide, hydride, intermetallic compound, alloy or metal gallium, each of which contains gallium, and it will be defined later.

It is preferable that a seed has a lattice constant of 2.8 to 3.6 with respect to $a_o$-axis and a surface dislocation density of $10^6/cm^2$ or less. Such a seed is selected from a body-centered cubic crystal system Mo or W, a hexagonal closest packing crystal system α-Hf or α-Zr, a tetragonal system diamond, a WC structure crystal system WC or $W_2C$, a ZnO structure crystal system α-SiC, TaN, NbN or AlN, a hexagonal (P6/mmm) system $AgB_2$, $AuB_2$ or $HFB_2$, and a hexagonal (P$6_3$/mmc) system γ-MoC or ε-MbN.

In the present invention, the crystallization of gallium-containing nitride is carried out at a temperature of 100 to 800° C., preferably 300 to 600° C., more preferably 400 to 550° C. Also, the crystallization of gallium-containing nitride is carried out under a pressure of 100 to 10,000 bar, preferably 1,000 to 5,500 bar, more preferably 1,500 to 3,000 bar.

The concentration of alkali metal ions in the supercritical solvent is so adjusted as to ensure the specified solubilities of feedstock or gallium-containing nitride, and the molar ratio of the alkali metal ions to other components of the resultant supercritical solution is controlled within a range from 1:200 to 1:2, preferably from 1:100 to 1:5, more preferably from 1:20 to 1:8.

In this regard, the present invention relates to a technique of an ammono-basic growth of a crystal which comprises a chemical transport in a supercritical ammonia solvent containing at least one mineralizer for imparting an ammono-basic property, to grow a gallium-containing nitride. This technique has a very high originality, and therefore, the terms herein used should be understood as having the meanings defined as below in the present specification.

The term "igallium-containing nitride" in the specification means a compound which includes at least gallium and nitrogen atom as a consistent element. It includes at least the binary compound GaN, ternary compounds such as AlGaN, InGaN or also quaternary compounds AlInGaN, where the range of the other elements to gallium can vary, in so far as the crystallization growth technique of ammonobasic is not hindered.

The term "bulk monocrystalline gallium-containing nitride" means a monocrystalline gallium-containing nitride substrate on which an optic and electronic device such as LED or LD can be formed by an epitaxial growing process such as MOCVD, HVPE or the like.

The term "a precursor of gallium-containing nitride" means a substance which contains at least gallium, and if needed, an alkali metal, an element of the Group XIII, nitrogen and/or hydrogen, or a mixture thereof, and examples of such a precursor includes metallic Ga, an alloy or an intermetallic compound of Ga, and a hydride, amide, imide, amidoimide or azide of Ga, which is used as a substitutive feedstock for gallium-containing nitride, and which can form a gallium compound soluble in a supercritical ammonia solvent as defined below.

The term "gallium-containing feedstock" means a gallium-containing nitride or a precursor thereof.

The term "supercritical ammonia solvent" means a supercritical solvent which contains at least ammonia, and ion or ions of at least one alkali metal for dissolving gallium-containing nitride.

The term "mineralizer" means a supplier for supplying one or more of alkali metal ions for dissolving gallium-containing nitride in the supercritical ammonia solvent, and specific examples thereof are described in the present specification.

The phrase "the dissolution of the gallium-containing feedstock" means a reversible or irreversible process in which the above feedstock takes the form of a gallium compound soluble in the supercritical solvent such as a gallium complex compound. The gallium complex compound means a complex compound in which a gallium as a coordination center is surrounded by ligands, e.g., $NH_3$ or derivatives thereof such as $NH_2^-$ and $NH^{2-}$.

The term "supercritical ammonia solution" means a soluble gallium-containing feedstock formed by the dissolution of the gallium-containing feedstock in the supercritical ammonia solvent. Based on our experiment, we have found that there is an equilibrium relationship between the gallium-containing nitride solid and the supercritical solution under a sufficiently high temperature and pressure atmosphere. Accordingly, the solubility of the soluble gallium-containing nitride can be defined as an equilibrium concentration of the above soluble gallium-containing nitride in the presence of solid gallium-containing nitride. In such a process, it is possible to shift this equilibrium according to change in temperature and/or pressure.

The phrase "negative temperature coefficient of the solubility" means that the solubility is expressed by a monotonically decreasing function of the temperature, when all other parameters are kept constant. Similarly, the phrase "positive pressure coefficient of the solubility" means that the solubility is expressed by a monotonically increasing function of the pressure, when all other parameters are kept constant. Based on our research, the solubility of soluble gallium-containing nitride in the supercritical ammonia solvent, at least, has a negative temperature coefficient within a range of 300 to 550° C., and a positive pressure coefficient within a range of 1 to 5.5 Kbar, respectively.

The phrase "oversaturation of the supercritical ammonia solution of gallium-containing nitride" means that the concentration of the soluble gallium compounds in the above supercritical ammonia solution is higher than a concentration in an equilibrium state, i.e., the solubility of gallium-containing nitride. In case of the dissolution of gallium-containing nitride in a closed system, such oversaturation can be achieved, according to a negative temperature coefficient or a positive pressure coefficient of the solubility, by raising the temperature or reducing the pressure.

The phrase "the chemical transport of gallium-containing nitride in the supercritical ammonia solution" means a sequential process including the dissolution of gallium-containing feedstock, the transfer of the soluble gallium compound through the supercritical ammonia solution, and the crystallization of gallium-containing nitride from the oversaturated supercritical ammonia solution. In general, a chemical transport process is carried out by a certain driving force such as a temperature gradient, a pressure gradient, a concentration gradient, difference in chemical or physical properties between a dissolved gallium-containing nitride and a crystallized product, or the like. Preferably, the chemical transport in the process of the present invention is achieved by carrying out the dissolution step and the crystallization step in separate zones, on condition that the temperature of the crystallization zone is maintained higher than that of the dissolution zone so that bulk monocrystalline gallium-containing nitride can be obtained by the processes of this invention.

The term "seed" has been described by way of examples in the present specification. The seed provides a region or area on which the crystallization of gallium-containing nitride is allowed to take place, and the growth quality of the crystal depends on the quality of the seed. Thus, the seed with good qualities is selected.

The term "spontaneous crystallization" means an undesirable phenomenon in which the formation and the growth of the core of gallium-containing nitride from the oversaturated supercritical ammonia solution occur at any site inside the autoclave, and the spontaneous crystallization also includes disoriented growth of the crystal on the surface of the seed.

The term "selective crystallization on the seed" means a step of allowing the crystallization to take place on the face of the seed, accompanied by substantially no spontaneous growth. This selective crystallization on the seed is essential for the growth of a bulk monocrystal, and it is one of the methods of the present invention.

The autoclave to be used in the present invention is a closed system reaction chamber for carrying out the ammono-basic growth of the crystal, and it may be in any form. GaN pellets to be used in the present invention are prepared by molding the powder of GaN and baking them so that its density is 70% or more. Higher density is preferable.

In this regard, the temperature distribution in the autoclave as will be described later in the part of Examples is determined by using the autoclave empty inside without the supercritical ammonia, and thus, the supercritical temperature is not one actually measured. On the other hand, the pressure in the autoclave is directly measured, or it is determined by the calculation from the amount of ammonia firstly introduced, and the temperature and the volume of the autoclave.

It is preferable to use an apparatus as described below, to carry out the above process. The present invention provides an apparatus for forming a bulk monocrystalline gallium-containing nitride which comprises an autoclave (1) for producing a supercritical solvent, a convection-controller (2) arranged in the autoclave, and a furnace unit (4) equipped with a heater (5) or a cooler (6), in which the autoclave is set.

The furnace unit (4) includes a higher temperature zone equipped with a heater (5) which corresponds to a crystallization zone (14) in the autoclave (1), and a lower temperature zone equipped with a heater (5) or a cooler (6) which corresponds to a dissolution zone (13) in the autoclave (1); or otherwise, the furnace unit (4) includes a higher temperature zone equipped with a heater (5) or a cooler (6) which corresponds to a crystallization zone (14) in the autoclave (1), and a lower temperature zone equipped with a heater (5) or a cooler (6) which corresponds to a dissolution zone (13) in the autoclave (1). The convection controller (2) may be composed of at least one horizontal baffle (12) which has a hole at the center or at its periphery and which partitions the crystallization zone (14) from the dissolution zone (13). Inside the autoclave (1), feedstock (16) is set in the dissolution zone (13), and a seed (17) is set in the crystallization zone (14), and the convection of a supercritical solution between the zones (13) and (14) is controlled by the controller (2). It is to be noted that the dissolution zone (13) is located above the horizontal baffle (12), and the crystallization zone (13), below the baffle (12).

BEST MODE FOR CARRYING OUT THE INVENTION

Figure 1:
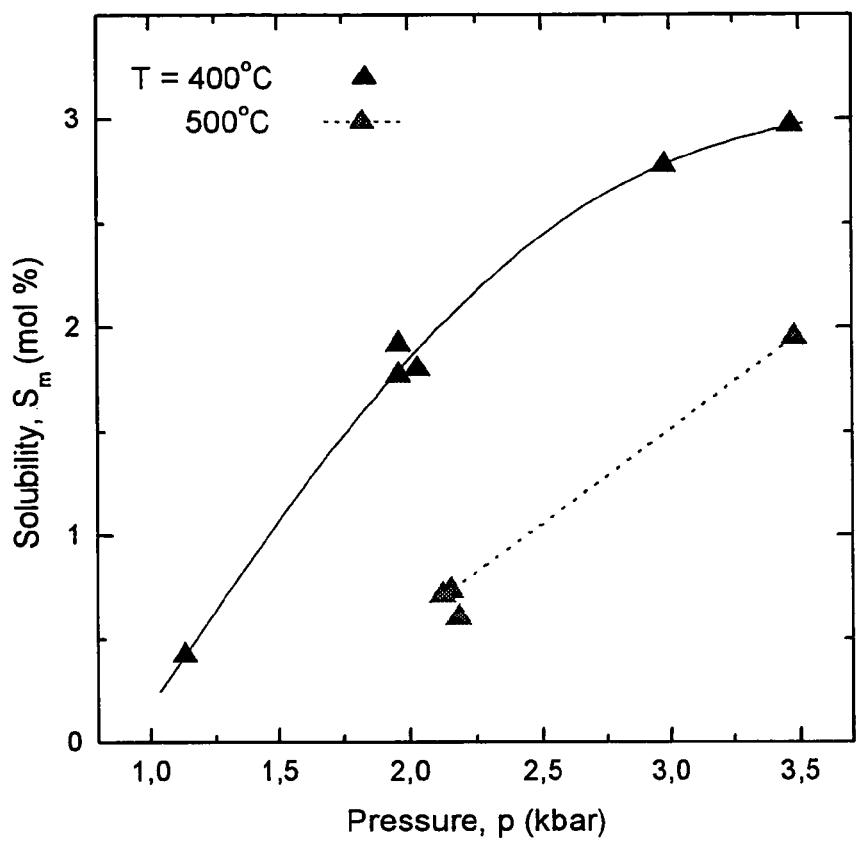
FIG. 1 shows a relation between pressure and GaN solubility in supercritical ammonia containing potassium amide (at molar ratio of $KNH_2:NH_3=0,07$) at T=400° C. and T=500° C.

The process of the present invention is divided into two steps, that is, a step of dissolving feedstock, and a step of moving a supercritical solution to a higher temperature zone or a lower pressure zone where the crystallization and growth of gallium-containing nitride on the face of a seed is carried out. Otherwise, it is also possible to divide the autoclave into at least two zones which have a difference in temperature from each other, and to set gallium-containing feedstock in a lower temperature dissolution zone, and a seed, in a higher temperature crystallization zone. The difference in temperature between the dissolution zone and the crystallization zone is selected within such a range that a chemical transport in the supercritical solution can be caused by convection. In this case, the difference in temperature between the dissolution zone and the crystallization zone is 1° C. or more. Gallium-containing nitride has the general formula $Al_xGa_{1-x-y}In_yN$, where $0 \leq x<1$, $0 \leq y<1$, and $0 \leq x+y<1$, and may contain a donor, an acceptor, a magnetic dopant, etc. As a supercritical solvent, ammonia ($NH_3$) or its derivative containing ion or ions of alkali metals (at least potassium) may be used. Gallium-containing nitride or a GaN precursor thereof can be used as a feedstock. The precursor is selected from an adide, imide, amidoimide, amide, hydride, intermetallic compound, alloy or metal gallium, each of which contains gallium, and it will be defined later. The seed has a crystalline layer of a nitride which contains, at least, gallium or other element of Group No. 13 (IUPAC, 1989) and preferably has a surface dislocation density of $10^6/cm^2$ or less.

The crystallization of gallium-containing nitride is carried out under the conditions where the temperature is from 100 to 800° C., and the pressure, from 100 to 10,000 bar, while the concentration of alkali metal ions in the supercritical solvent is so controlled that appropriate solubility of feedstock and gallium-containing nitride can be ensured, and the molar ratio of the alkali metal ions to other components in the supercritical solvent is controlled within a range of from 1:200 to 1:2.

The apparatus for forming a monocrystalline gallium-containing nitride comprises an autoclave equipped with a convention controller, which is to produce a supercritical solvent; and at least one furnace unit equipped with a heater and/or a cooler, in which the autoclave is set. The furnace unit includes a higher temperature zone equipped with a heater which corresponds to the crystallization zone in the autoclave, and a lower temperature zone equipped with a heater and/or a cooler which corresponds to the dissolution zone in the autoclave. It is also possible to use a furnace unit which includes a higher temperature zone equipped with a heater and/or a cooler, and a lower temperature zone equipped with a heater and/or a cooler. The convection controller is composed of at least one horizontal baffle having a hole at the center or its periphery so as to partition the crystallization zone from the dissolution zone. Thus, feedstock is set in the dissolution zone, and the seed, in the crystallization zone, in the autoclave. The convection of the supercritical solution between the dissolution zone and the crystallization zone is controlled by the above controller. The dissolution zone is located above the horizontal baffle, and the crystallization zone, below the horizontal baffle.

Based on the result of the research, an obtainable best bulk monocrystalline GaN has a surface dislocation density of about $10^4/cm^2$, and the full width at half maximum of the X-ray from the surface (0002) is 60 arcsec. or less. Therefore, a semiconductor device using such a bulk monocrystalline GaN can ensure a proper quality and a proper lifetime.

GaN shows a good solubility in ammonia ($NH_3$) containing an alkali metal or a compound thereof ($KNH_2$ or the like). In a graph on FIG. 1, a solubility of GaN in supercritical solvent is shown as a function of pressure at a temperature of 400° C. and 500° C. Said solubility is defined as molar percentage (%), S≡GaN (solution): ($KNH_2+NH_3$)X 100%. In this case, the solvent refers to the $KNH_2$ solvent in supercritical ammonia; molar ratio X≡$KNH_2:NH_3$=0.07. According to said graph, the solubility is a monotonically increasing function of the pressure and also a monotonically decreasing function of the temperature. By making use of this relationship, gallium-containing nitride is dissolved under a condition where the solubility becomes higher, and gallium-containing nitride is crystallized under a condition where the solubility becomes lower, so that a bulk monocrystalline GaN can grow. This negative temperature gradient indicates that, if a difference in temperature arises, the chemical transport of gallium-containing nitride is carried out from the lower temperature dissolution zone to the higher temperature crystallization zone.

It has turned out that also other gallium compounds and even metallic gallium may become sources of GaN complex compounds. For example, gallium complex compounds could be introduced into a solvent having the above composition starting with the simplest substrate, i.e. metallic gallium or Ga complex compounds. Next, an oversaturated solution relative to gallium-containing nitride is formed by appropriately changing the conditions, for example, by heating, so that a crystal is grown on the face of the seed containing at least one element or compound selected from Mo and W of body-centered cubic structure, α-Hf and α-Zr of hexagonal closest packing structure, diamond of tetragonal structure, WC and $W_2C$ of WC structure, SiC, especially α-SiC, TaN, NbN and AlN of ZnO structure, $AgB_2$, $AuB_2$ and $HfB_2$ of hexagonal structure (P6/mmm), and γ-MoC and ε-MbN of hexagonal structure ($P6_3$/mmc). It is preferable that the conductive body-centered cubic crystal or conductive phase-centered cubic crystal may be cut from the direction [1, 1, 1] i.e. α-SiC, Mo and W etc. for use as a seed. The process of the present invention makes it possible to grow a bulk monocrystalline gallium-containing nitride on the face of the seed, which leads to stoichiometric growth of GaN obtained as a bulk monocrystalline layer on a seed of monocrystalline GaN. The above monocrystal is grown in the supercritical solution containing alkali metal ion or ions, and therefore, the resultant monocrystalline also contains 0.1 ppm or more of alkali metal. In addition, to maintain the basic property of the supercritical solution in order to prevent the corrosion of the apparatus, no halide is intentionally added to the solvent. By the process of this invention, Ga from 0.05 to 0.5 can be replaced with Al or In. Since the elements can be altered flexibly, lattice constant of resulted nitride can be adjusted. Further, the bulk monocrystalline GaN may be doped with a donor (e.g., Si, O, etc.), an acceptor (e.g., Mg, Zn, etc.) and a magnetic substance (e.g., Mn, Cr, etc.) at a concentration of $10^{17}$ to $10^{21}/cm^3$. The optical, electrical and magnetical characteristics of gallium-containing nitride can be changed by this doping. As other physical properties, the grown bulk monocrystalline GaN has a surface dislocation density of $10^6/cm^2$ or less, preferably $10^5/cm^2$ or less, more preferably $10^4/cm^2$ or less. It is possible to grow a bulk monocrystalline gallium-containing nitride where the full width at half maximum of the X-ray from the surface (0002) is 600 arcsec. or less, preferably 300 arcsec or less, more preferably 60 arcsec or less. It is possible to grow the best bulk monocrystalline GaN where a surface dislocation density is $10^4/cm^2$ or less and the full width at half maximum of the X-ray from the surface (0002) is 60 arcsec or less.

EXAMPLES

Example 1

Figure 2:
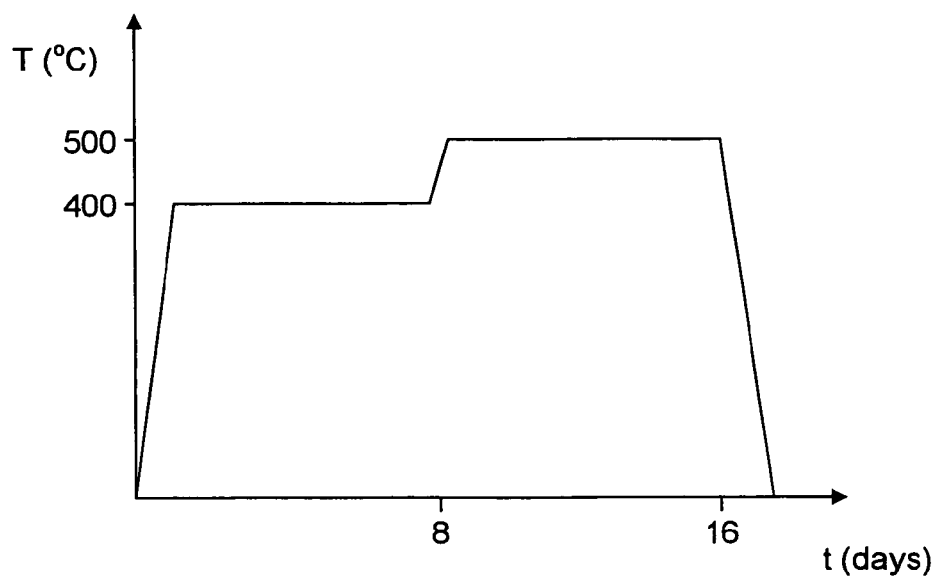
FIG. 2 shows a graph illustrating a change in temperature in an autoclave with the passage of time, on condition that the pressure is kept constant, in case of Example (1).

Two crucibles are introduced into the high-pressure autoclave having a volume of 10.9 $cm^3$ made on the basis of a known design solution [H. Jacobs, D. Schmidt, Current Topics in Materials Science, vol.8, ed. E. Kaldis (North-Holland, Amsterdam, 1981), 381], one containing 0.4 g of GaN in the form of 0.1 mm thin strips prepared by HVPE method as a feedstock, second containing α-SiC seed. 0.72 g of 4N purity metallic potassium is introduced into the autoclave. The autoclave is filled with 4.81 g of ammonia, and closed. The autoclave is introduced into the furnace and heated to 400° C. Pressure inside the autoclave is 2 kbar. The temperature is increased to 500° C. after 8 days, with pressure maintained at 2 kbar. The autoclave is kept under such conditions for another 8 days (graph on FIG. 2). The process leads to total dissolution of a feedstock and recrystallization of the GaN layer on the partly dissolved seed.

Example 2

Figure 3:
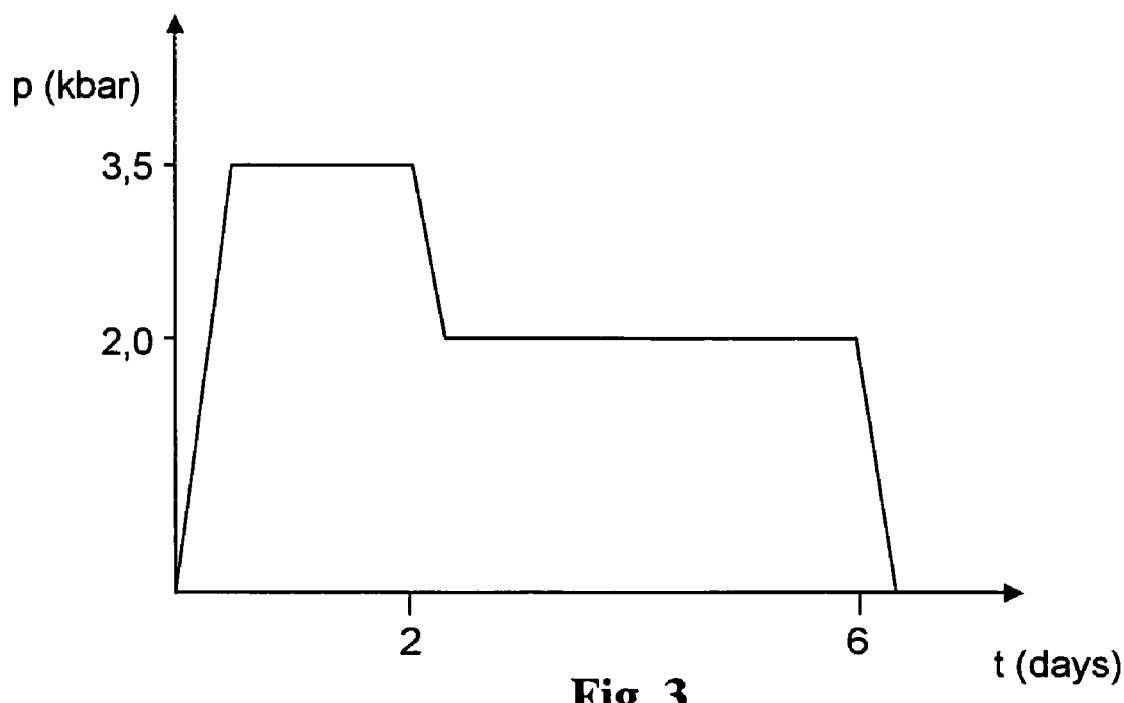
FIG. 3 shows a graph illustrating a change in pressure in an autoclave with the passage of time, on condition that the temperature is kept constant, in case of Example (2).

Two crucibles are introduced into the high-pressure autoclave having a volume of 10.9 $cm^3$, one containing 0.44 g of GaN in the form of 0.1 mm thin strips prepared by HVPE method as a feedstock, second containing α-SiC seed. 0.82 g of 4N purity metallic potassium is introduced into the autoclave. The autoclave is filled with 5.43 g of ammonia, and closed. The autoclave is introduced into the furnace and heated to 500° C. Pressure inside the autoclave is 3.5 kbar. After two days, the pressure is decreased to 2 kbar and the temperature is kept 500° C., and the autoclave in this state is left to stand alone for four days for crystallization (FIG. 3). The process leads to total dissolution of a feedstock and recrystallization of the GaN layer on the seed.

Example 3

Figure 4:
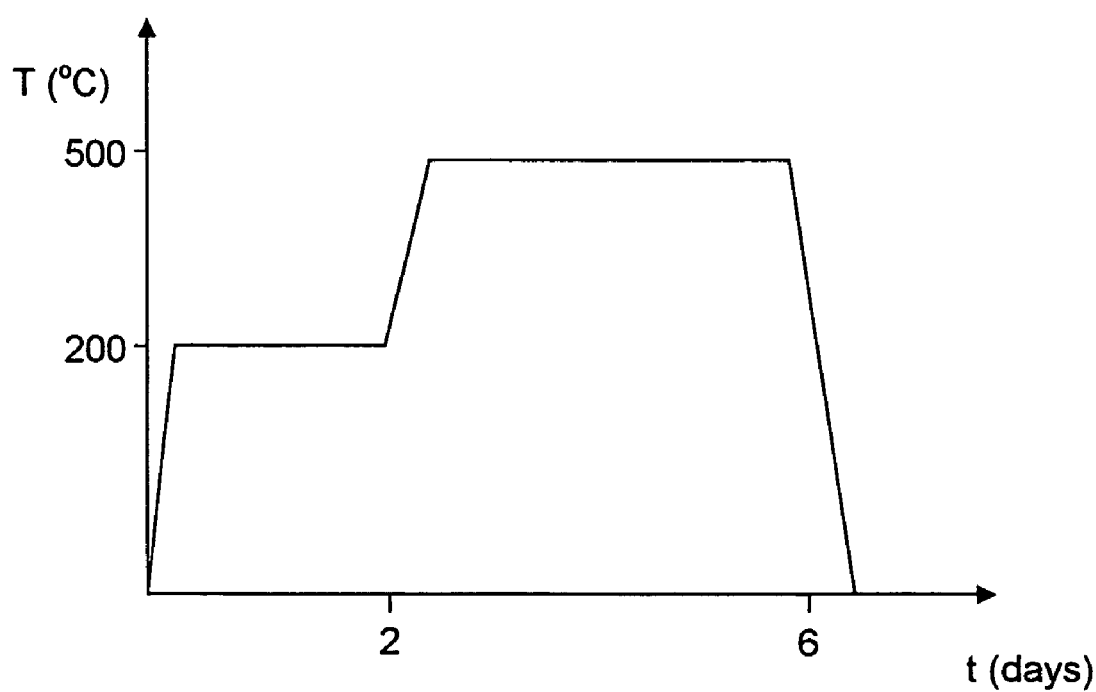
FIG. 4 shows a graph illustrating a change in temperature in an autoclave with the passage of time, on condition that the volume is kept constant, in case of Example (3).

Two crucibles are introduced into the high-pressure autoclave having a volume of 10.9 $cm^3$, one containing 0.3 g 6N purity metallic gallium as a feedstock, second containing α-SiC seed. 0.6 g of 4N purity metallic potassium is introduced into the autoclave. The autoclave is filled with 4.0 g of ammonia, and closed. The autoclave is introduced into the furnace and heated to 200° C. After two days, the temperature is increased 500° C. and the pressure is 2 kbar, and the autoclave in this state is left to stand alone for four days (FIG. 4). The process leads to total dissolution of a feedstock and recrystallization of the GaN layer on the seed.

Example 4

Figure 5:
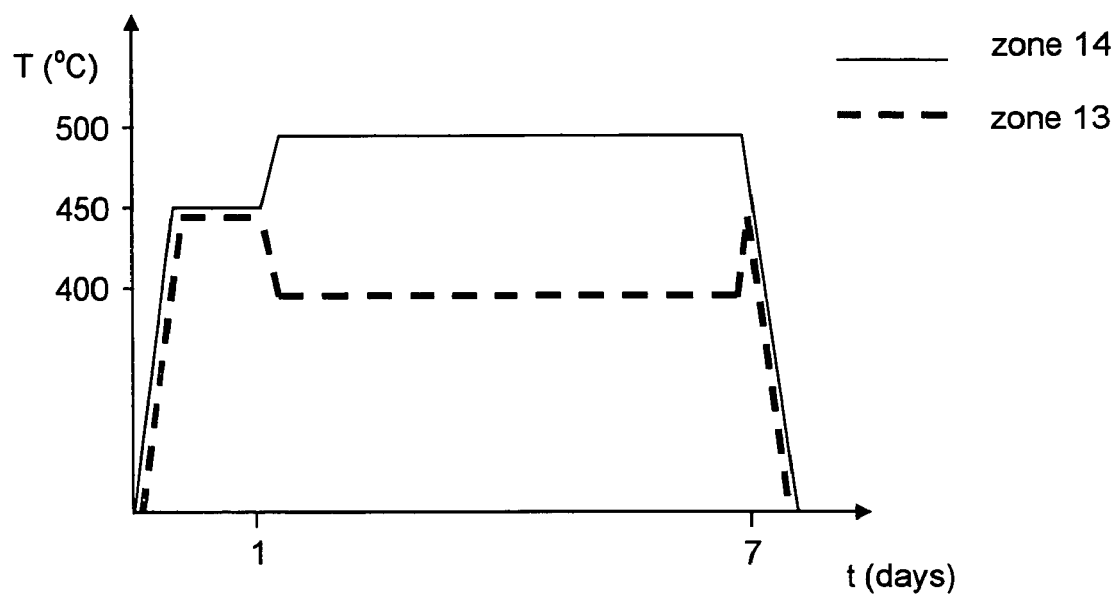
FIG. 5 shows a graph illustrating a change in temperature in an autoclave with the passage of time, in case of Example (4).
Figure 9:
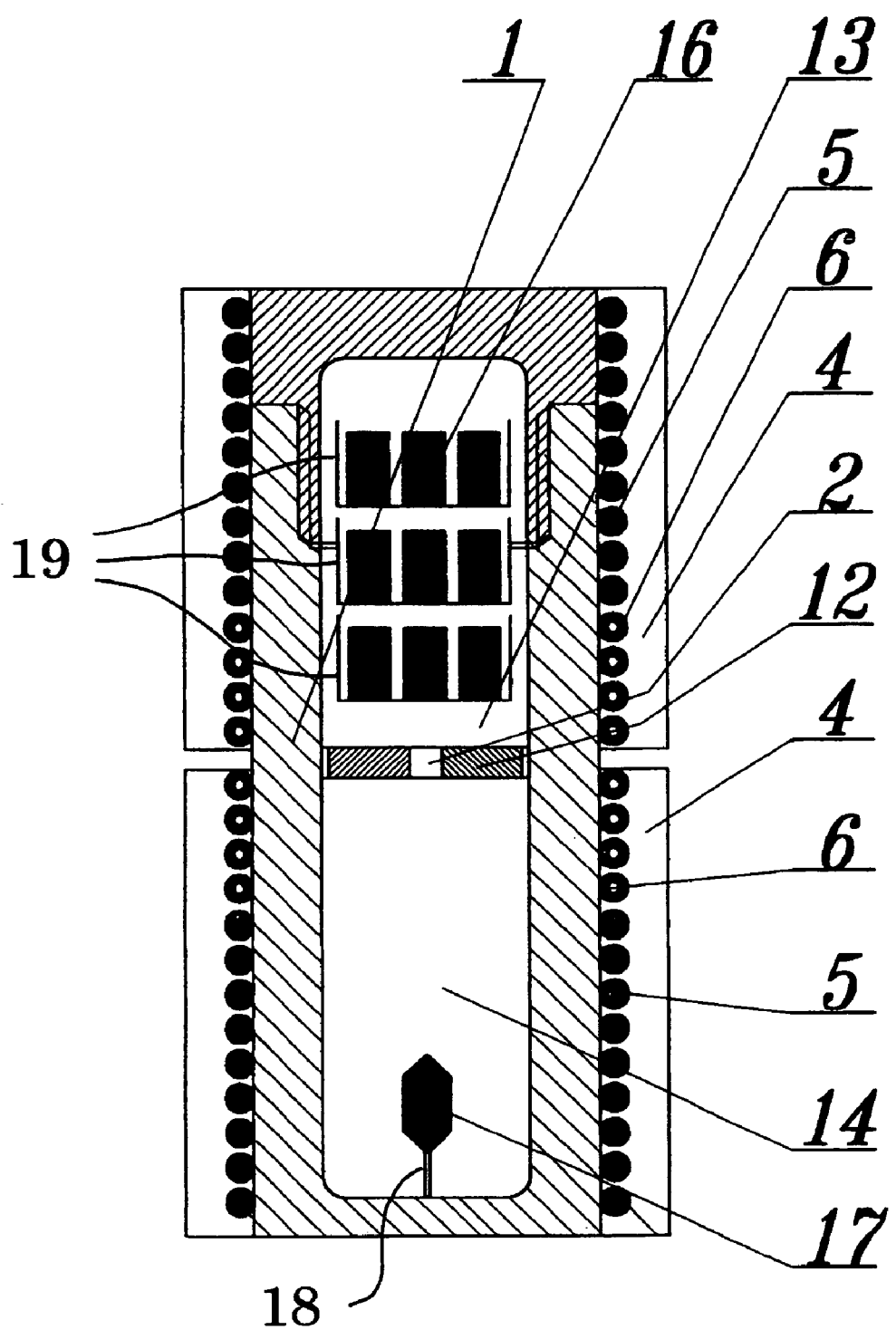
FIG. 9 is a schematic sectional view of an autoclave and a furnace unit used in Example4, 5, 6 and 7.
Figure 10:
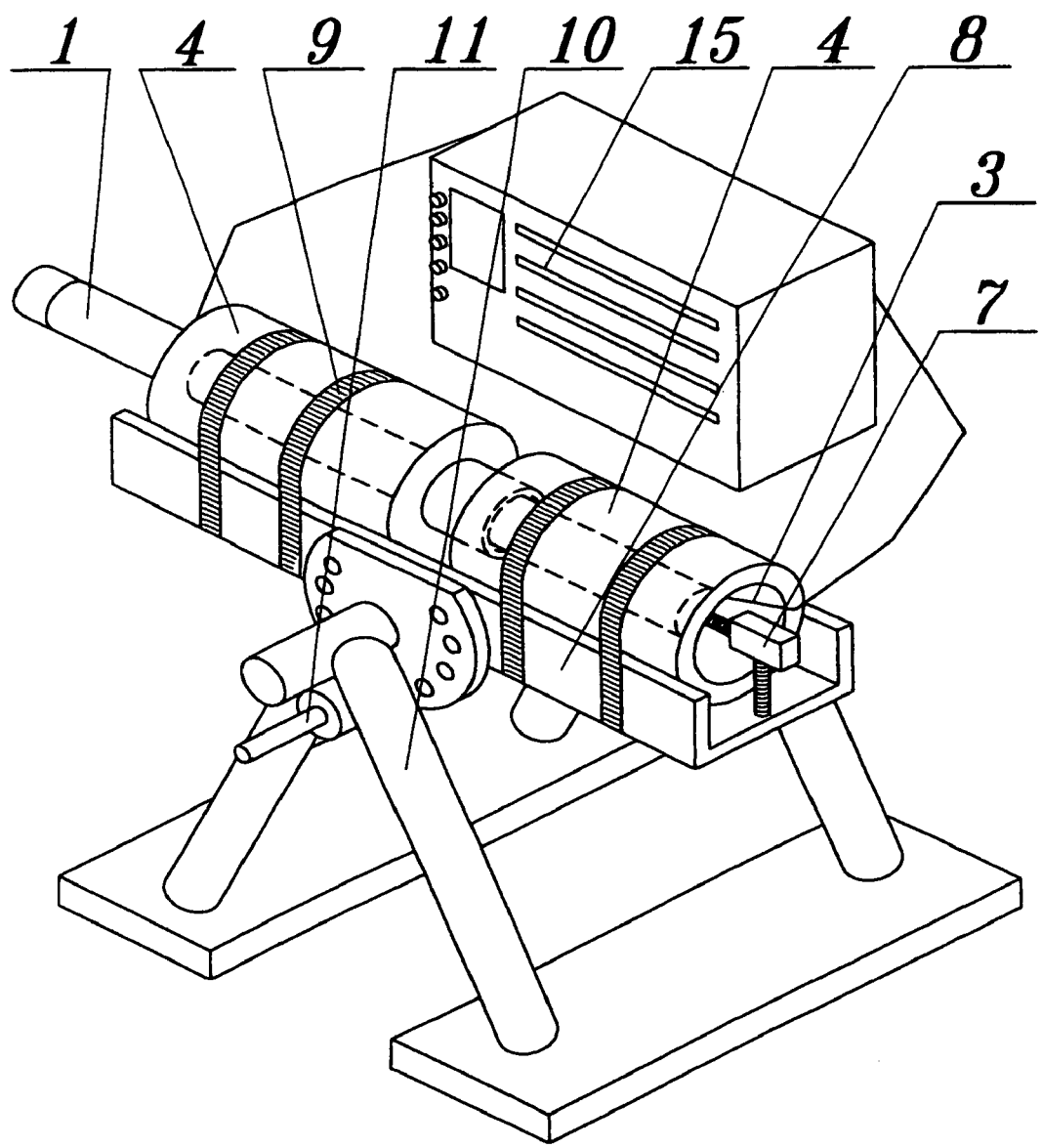
FIG. 10 is a schematic perspective view of an apparatus for forming a bulk monocrystalline gallium-containing nitride.

1.5 g of GaN prepared by HVPE method is placed in dissolution zone (13) of the 35.6 $cm^3$ high-pressure autoclave (1) (FIG. 9), α-SiC crystal is placed in the crystallization zone (14), and 2.4 g of 4N purity metallic potassium is introduced. Next, the autoclave (1) is filled with 15.9 g of ammonia (5N) and closed. Autoclave (1) is then introduced into the furnace units (4) and heated to about 450° C. Pressure inside the autoclave is 2 kbar. After one day, the temperature of crystallization zone (14) is increased to 500° C., and temperature of dissolution zone (13) is decreased to 400° C. and the autoclave is maintained under those conditions for further 6 days (FIG. 5). The process leads to partial dissolution of feedstock in the dissolution zone (13) and the growth of gallium nitride on α-SiC seed in the crystallization zone (14).

Example 5

Figure 6:
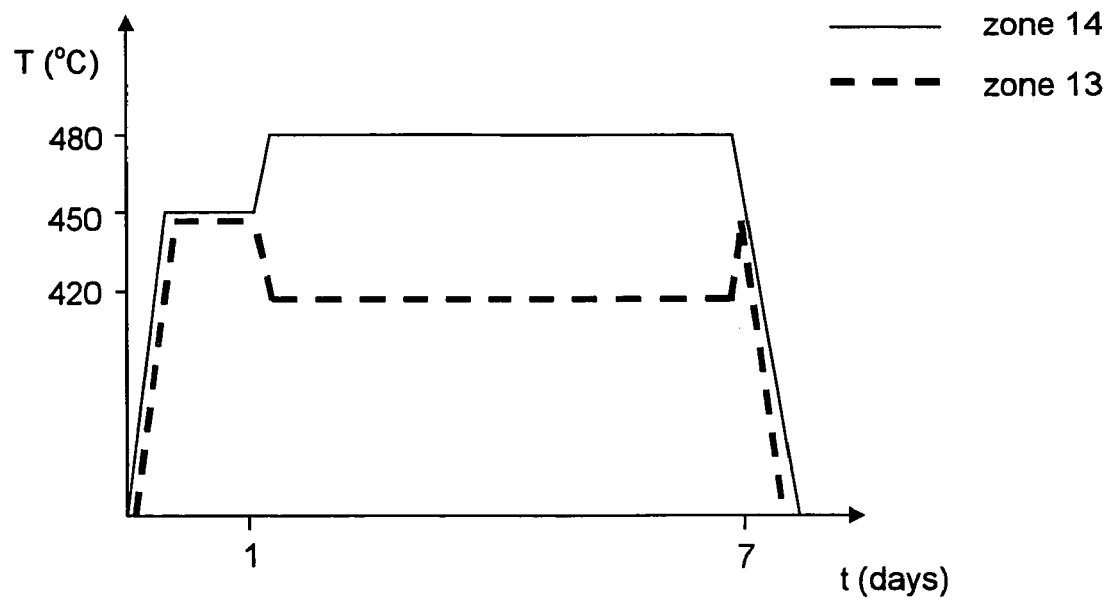
FIG. 6 shows a graph illustrating a change in temperature in an autoclave with the passage of time, in case of Example (5).

3.0 g of GaN pellet feedstock is placed in dissolution zone (13) of the 35.6 cm$^3$ high-pressure autoclave (1) (FIG. 9), α-SiC seed is placed in the crystallization zone (14), and 2.4 g of 4N purity metallic potassium is introduced. Next, the autoclave (1) is filled with 15.9 g of ammonia (5N) and closed. Autoclave (1) is then introduced into the furnace units (4) and heated to about 450° C. Pressure inside the autoclave is 2 kbar. After one day, the temperature of crystallization zone (14) is increased to 500° C., and temperature of dissolution zone (13) is decreased to 420° C. and the autoclave is maintained under those conditions for further 6 days (FIG. 6). The process leads to partial dissolution of feedstock in the dissolution zone (13) and the growth of gallium nitride on seed in the crystallization zone (14).

Example 6

Figure 7:
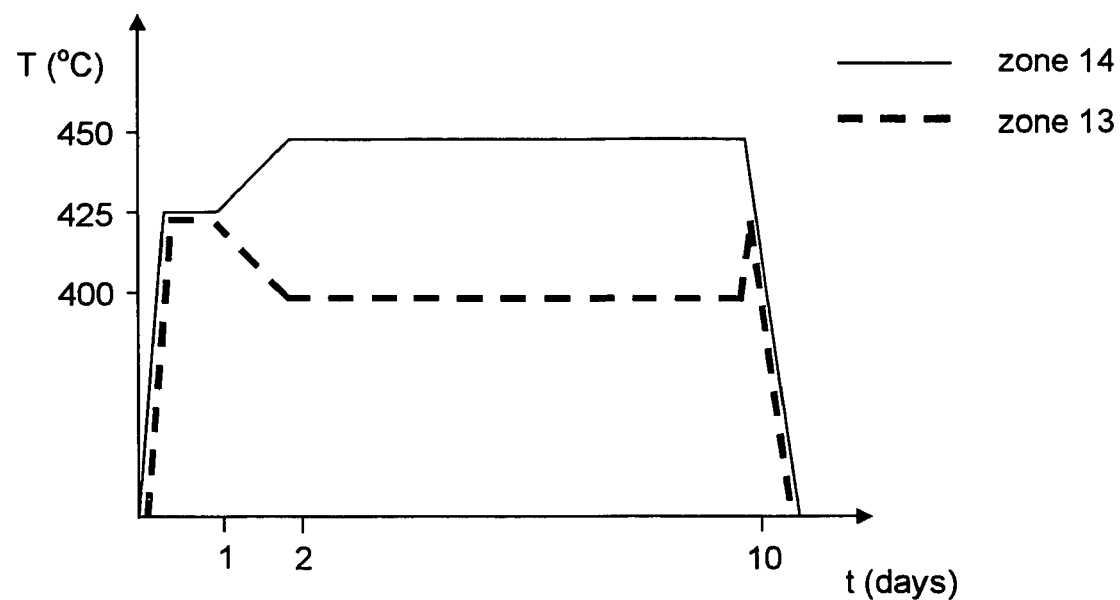
FIG. 7 shows a graph illustrating a change in temperature in an autoclave with the passage of time, in case of Example (6).

1.6 g of GaN prepared by HVPE method is placed in dissolution zone (13) of the 36 cm$^3$ high-pressure autoclave (1) (FIG. 9), α-SiC seed is placed in the crystallization zone (14), and 3.56 g of 4N purity metallic potassium is introduced. Next, the autoclave (1) is filled with 14.5 g of ammonia (5N) and closed. Autoclave (1) is then introduced into the furnace units (4) and heated to about 425° C. Pressure inside the autoclave is 1.5 kbar. After one day, temperature of dissolution zone (13) is decreased to 400° C. and the temperature of crystallization zone (14) is increased to 450° C., and the autoclave is maintained under those conditions for further 8 days (FIG. 7). The process leads to partial dissolution of feedstock in the dissolution zone (13) and the growth of gallium nitride on α-SiC seed in the crystallization zone (14).

Example 7

Figure 8:
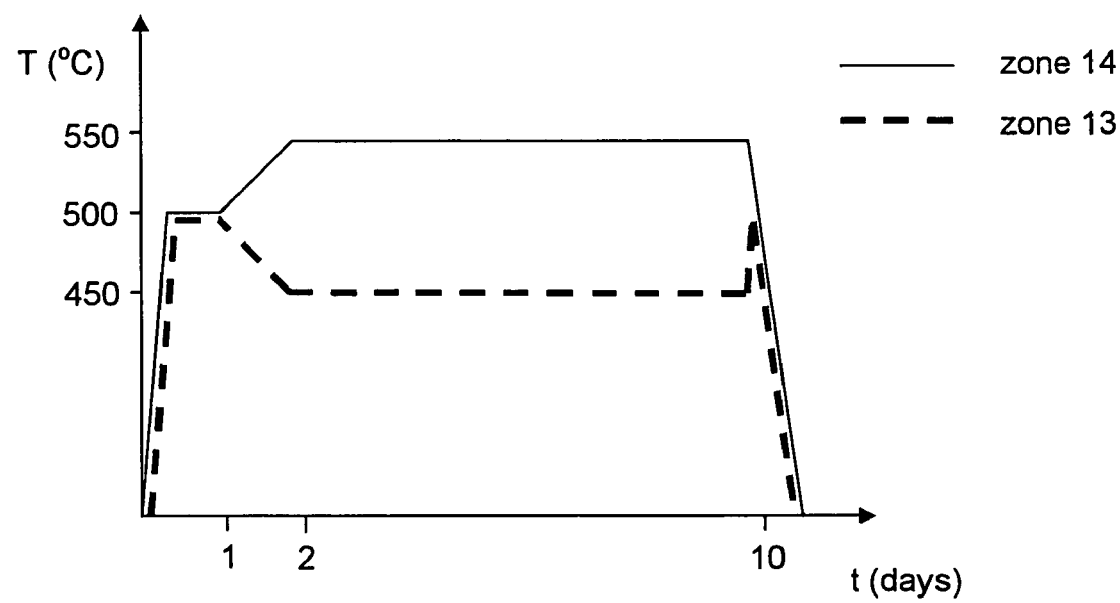
FIG. 8 shows a graph illustrating a change in temperature in an autoclave with the passage of time, in case of Example (7).

2.0 g of GaN prepared by HVPE method and 0.47 g of 4N purity metallic potassium is placed in dissolution zone (13) of the 36 cm$^3$ high-pressure autoclave (1) (FIG. 9), α-SiC seed is placed in the crystallization zone (14). Next, the autoclave (1) is filled with 16.5 g of ammonia (5N) and closed. Autoclave (1) is then introduced into the furnace units (4) and heated to about 500° C. Pressure inside the autoclave is 3 kbar. After one day, temperature of dissolution zone (13) is decreased to 450° C. and the temperature of crystallization zone (14) is increased to 550° C., and the autoclave is maintained under those conditions for the next 8 days (FIG. 8). The process leads to partial dissolution of feedstock in the dissolution zone (13) and the growth of gallium nitride on α-SiC seed in the crystallization zone (14).

Example 8

Figure 11:
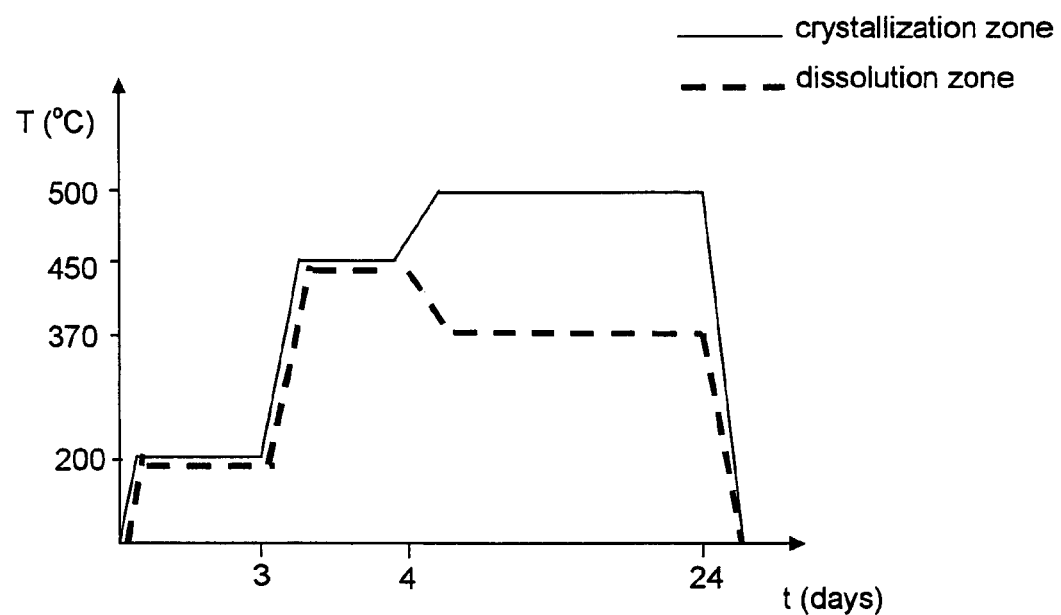
FIG. 11 shows a graph illustrating a change in temperature in an autoclave with the passage of time, in case of Example (8).

1.0 g of GaN prepared by the HVPE method is placed as feedstock in the dissolving zone of a 35.6 cm$^3$ high-pressure autoclave, while in crystallization zone of the autoclave α-SiC seed is placed. Next, the autoclave is charged with 1.2 g of metallic gallium 6N purity and 2.2 g of metallic potassium 4N purity. Subsequently the autoclave is filled with 15.9 g of ammonia (5N), closed, introduced into furnace units and heated to 200° C. After 3 days—during which period full metallic gallium is dissolved forming of gallium complexes in the supercritical solution, the temperature is increased to 450° C. A pressure inside the autoclave is about 230 MPa. After one day, the temperature of crystallization zone is increased to 500° C. and temperature of the dissolution zone is decreased to 370° C. and the autoclave is maintained under those conditions for further 20 days (graph on FIG. 11). In result of the process, partial dissolution of the feedstock takes place in the dissolution zone and growth of monocrystalline gallium nitride layer on the both sides of the seed in the crystallization zone.

Example 9

Figure 12:
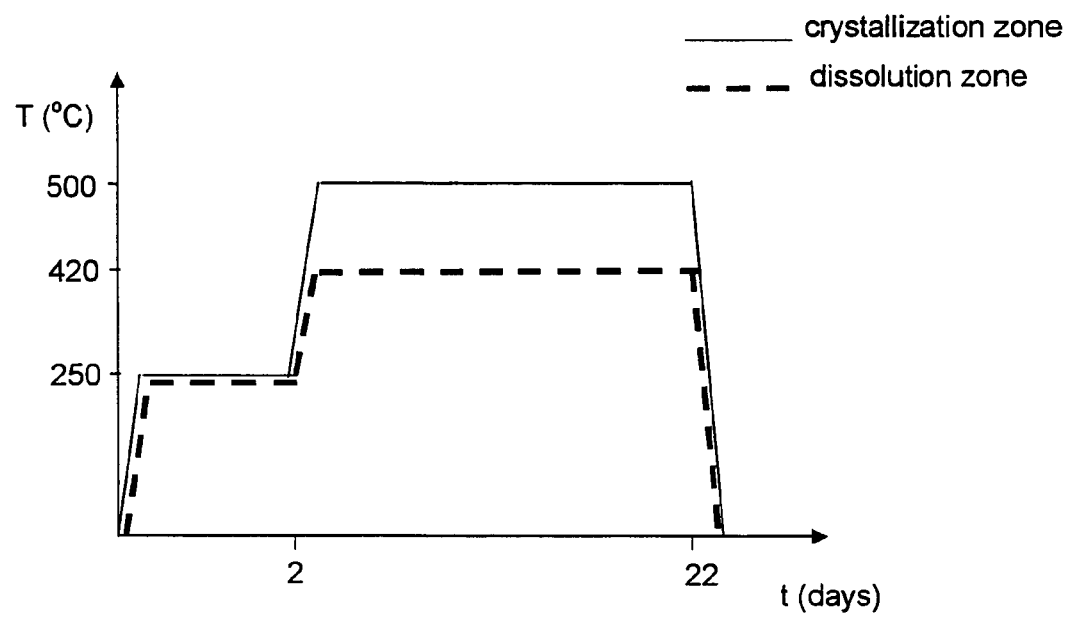
FIG. 12 shows a graph illustrating a change in temperature in an autoclave with the passage of time, in case of Example (9).

3.0 g of GaN pellet feedstock is placed in the dissolving zone of a 35.6 cm$^3$ high-pressure autoclave, while in crystallization zone of the autoclave α-SiC seed is placed. Next, the autoclave is charged with 2.3 g of metallic potassium 4N purity and 15.9 g of ammonia (5N), closed, introduced into furnace units and heated to 250° C. to obtain the preparatory oversaturated solution using gallium complex compounds by partial dissolution of GaN pellet. After two days, the temperature of crystallization zone is increased to 500° C. and temperature of the dissolution zone is decreased to 420° C. and the autoclave is maintained under those conditions for further 20 days (FIG. 12). In result of the process, dissolution of the large part of feedstock takes place in the dissolution zone and growth of gallium nitride layer on the both sides of the seed in the crystallization zone.

Example 10

Figure 13:
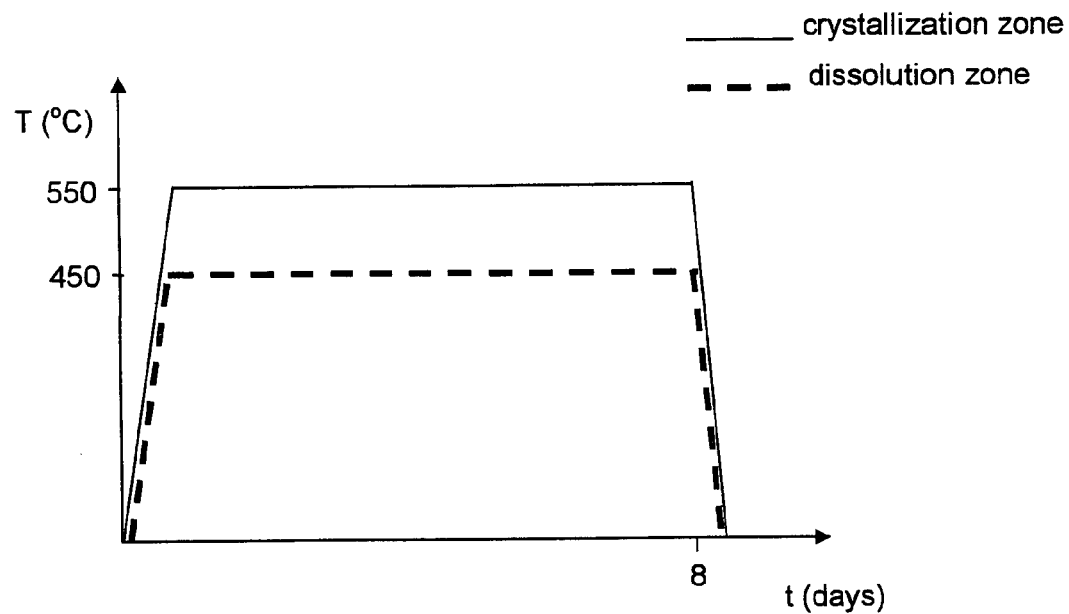
FIG. 13 shows a graph illustrating a change in temperature in an autoclave with the passage of time, in case of Example (10).

0.5 g of feedstock in the form of GaN plate having thickness of about 120 μm prepared by the HVPE method is placed in the dissolving zone (13) of a 35.6 cm$^3$ high-pressure autoclave (1), while in crystallization zone (14) α-SiC seed is placed. Next, the autoclave is charged with 0.41 g of metallic lithium 3N purity and 14.4 g of ammonia (5N) and closed. Autoclave is then introduced into the furnace units. The temperature of the crystallization zone is increased to 550° C., while the temperature of the dissolution zone is increased to 400° C. Pressure inside the autoclave is 2.6 kbar. The autoclave is maintained under those conditions for further 8 days (FIG. 13). In result of the process, partial dissolution of the feedstock takes place in the dissolution zone and growth of gallium nitride layer on the both sides of the seed in the crystallization zone.

Example 11

Figure 14:
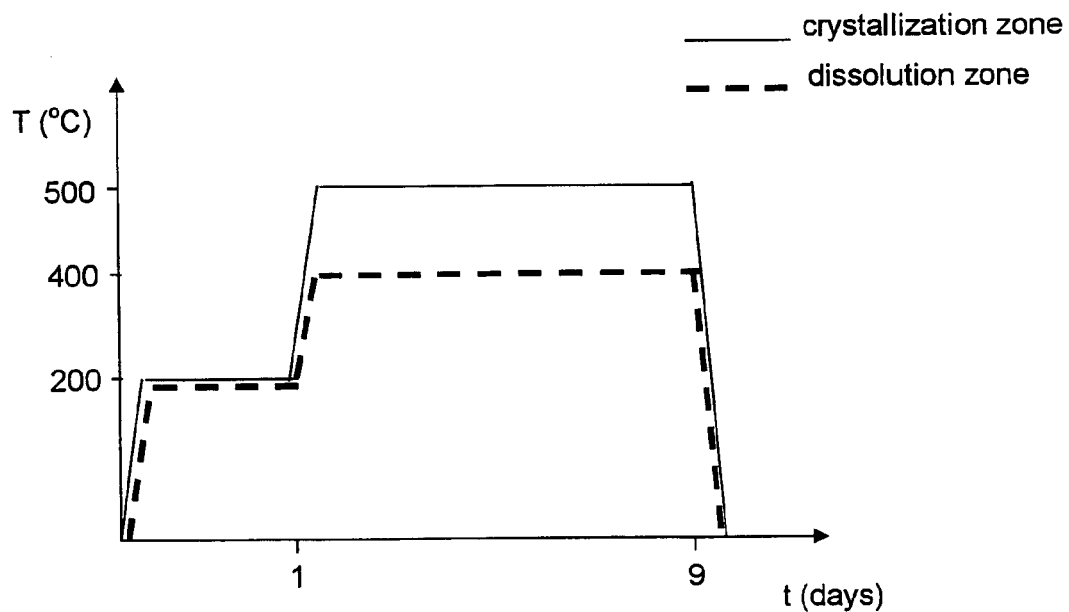
FIG. 14 shows a graph illustrating a change in temperature in an autoclave with the passage of time, in case of Example (11) and (12).

0.5 g of feedstock in the form of GaN plate having thickness of about 120 μm prepared by the HVPE method is placed in the dissolving zone (13) of a 35.6 cm$^3$ high-pressure autoclave (1), while in crystallization zone (14) α-SiC seed is placed. Next, the autoclave is charged with 0.071 g of metallic gallium 6N purity, 1.4 g of metallic sodium 3N purity and 14.5 g of ammonia (5N), closed, introduced into furnace units and heated to 200° C. After one day, metallic gallium becomes dissolved so that soluble gallium is formed in the supercritical solution. The temperature of the crystallization zone is increased to 500° C. and the temperature of the dissolution zone is increased to 400° C. Pressure inside the autoclave is 2.3 kbar. The autoclave is maintained under those conditions for further 8 days (FIG. 14). In result of the process, partial dissolution of the feedstock takes place in the dissolution zone and growth of gallium nitride layer on the both sides of the seed in the crystallization zone.

Example 12

0.5 g of feedstock in the form of GaN plate having thickness of about 120 μm prepared by the HVPE method is placed in the dissolving zone (13) of a 35.6 cm³ high-pressure autoclave (1), while in crystallization zone (14) α-SiC seed is placed. Next, the autoclave is charged with 0.2 g of gallium amide, 1.4 g of metallic sodium 3N purity and 14.6 g of ammonia (5N), closed, introduced into furnace units and heated to 200° C. After one day, gallium amide becomes dissolved so that soluble gallium is formed in the supercritical solution. The temperature of the crystallization zone is increased to 500° C., while the temperature of the dissolution zone is increased to 400° C. Pressure inside the autoclave is 2.3 kbar. The autoclave is maintained under those conditions for further 8 days (FIG. 14). In result of the process, partial dissolution of the feedstock takes place in the dissolution zone and growth of gallium nitride layer on the both sides of the seed in the crystallization zone.

Example 13

Figure 15:
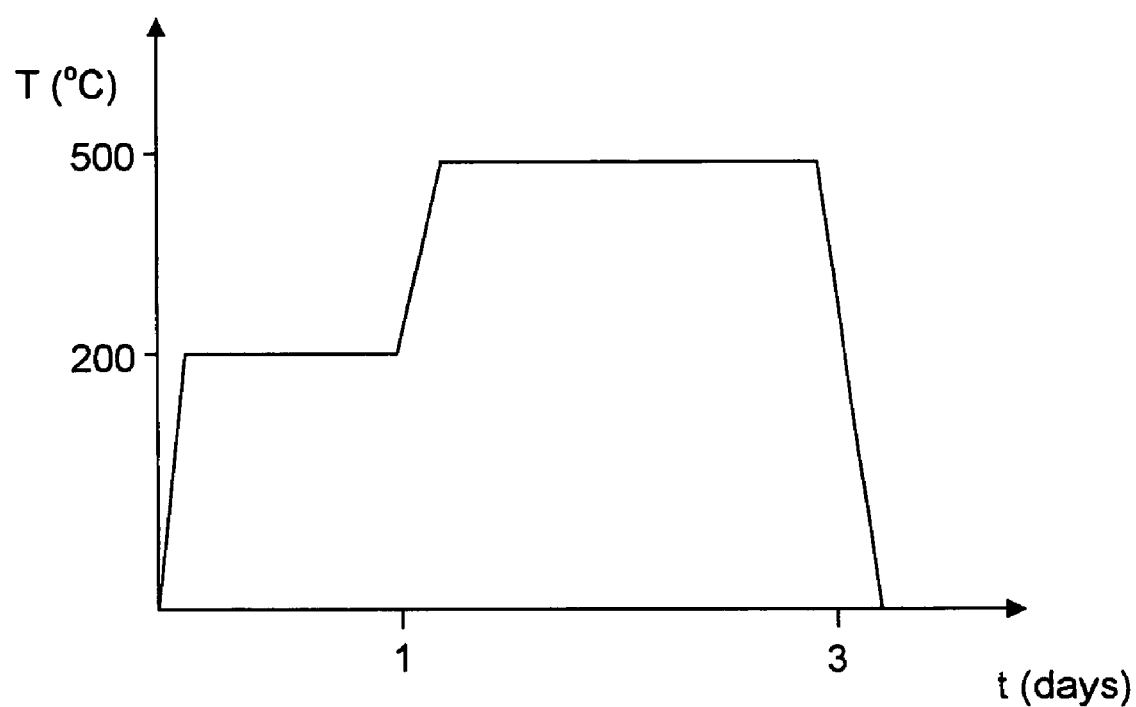
FIG. 15 shows a graph illustrating a change in temperature in an autoclave with the passage of time, in case of Example (13).

Two crucibles are introduced into the high-pressure autoclave having a volume of 10.9 cm³, one containing 0.3 g 6N purity metallic gallium as a feedstock, second containing three α-SiC seeds. 0.5 g of 4N purity metallic sodium is introduced into the autoclave. The autoclave is filled with 5.9 g of ammonia, closed, introduced into the furnace and heated to 200° C. The pressure inside the autoclave is 2.5 kbar. After one day, the temperature is increased 500° C., the pressure inside the autoclave is kept 5 kbar and the autoclave in this state is left to stand alone for two further days (FIG. 15). The process leads to total dissolution of a feedstock and recrystallization of the GaN layer on the seed.

Example 14

The process of growing GaN crystal on the seed is same as that of the examples 1 to 13, except that the seed where Mo of body-centered cubic structure is cut from the direction [1, 1, 1] is used instead of α-SiC seed.

Example 15

The process of growing GaN crystal on the seed is same as that of the examples 1 to 13, except that the seed where W of body-centered cubic structure is cut from the direction [1, 1, 1] is used instead of α-SiC seed.

The process according to the present invention is carried out by using the apparatus which forms a bulk monocrystalline gallium-containing nitride in a supercritical solvent. This apparatus essentially comprises the autoclave (1) for producing the supercritical solvent, and the controller (2) which makes it possible to cause a chemical transport in the supercritical solution in the autoclave (1). This autoclave (1) is set in the chambers (3) of two furnace units (4) equipped with the heaters (5) or the coolers (6). The autoclave (1) was fixed with a bolt locking device (7) and held at a predetermined position relative to the furnace units (4). The furnace units (4) are placed on a hearth (8) and are wound together with the hearth (8) with a steel tape (9) so as to be fixed. The furnace units (4) with the hearth (8) are set on a turn table (10) and fixed thereto at a specified angle with a pin locking device (11) so that the type of convection and the convection speed in the autoclave (1) can be controlled. The convection of the supercritical solution in the autoclave (1) set in the furnace units (4) is controlled by the convection controller (2) which may be composed of at least one horizontal baffle (12) having a hole at the center or at its periphery and which partitions the crystallization zone (14) from the dissolution zone (13). The temperatures of both zones in the autoclave (1) are set at 100 to 800° C., respectively, by a control unit (15) connected to the furnace units (4). The dissolution zone (13) in the autoclave (1) which corresponds to a lower temperature zone of one furnace unit (4) is located above the horizontal baffle (12), and includes the feedstock (16) set therein. The crystallization zone (14) in the autoclave which corresponds to a higher temperature zone of the other furnace unit (4) is located below the horizontal baffle (12). The seed (17) is set in this zone (14), and specifically is located below an intersecting point of the upstream and the downstream in the convection.

Industrial Applicability

The bulk monocrystalline gallium-containing nitride become grown on the resultant heterogeneous substrate seed, especially using conductive α-SiC, Mo and W as a seed has preferably a conductivity and also has a high crystalinity. Therefore can be applied to a substrate for various electronics devices and optical devices such as laser diode, etc. which employ nitride semiconductors.

The invention claimed is:

1. A process for obtaining a bulk monocrystalline gallium-containing nitride on the surface of heterogeneous substrate, comprising the steps of:
    forming a supercritical ammonia solvent containing ion or ions of alkali metals in an autoclave;
    dissolving a gallium-containing feedstock in the supercritical ammonia solvent to form a supercritical solution in which the feedstock is dissolved; and
    crystallizing gallium-containing nitride on the face of a seed which contains no element of oxygen and has a lattice constant of 2.8 to 3.6 with respect to $a_o$-axis from the supercritical solution, under a condition of a higher temperature and/or a lower pressure than the temperature and/or the pressure where the gallium-containing feedstock is dissolved in the supercritical solvent.

2. The process according to claim 1, wherein the seed has at least one layer containing at least one element or compound selected from Mo and W of body-centered cubic structure, α-Hf and α-Zr of hexagonal closest packing structure, diamond of tetragonal structure, WC and $W_2C$ of WC structure, SiC, TaN, NbN and AlN of ZnO structure, $AgB_2$, $AuB_2$ and $HfB_2$ of hexagonal structure (P6/mmm), and γ-MoC of hexagonal structure ($P6_3$/mmc) on the surface thereof.

3. The process according to claim 1, wherein at least two zones having a difference in temperature therebetween are concurrently formed in the autoclave, and wherein the gallium-containing feedstock is set in the lower temperature dissolution zone, and the seed, in the higher temperature crystallization zone.

4. The process according to claim 1, wherein the gallium-containing nitride has the general formula $Al_xGa_{1-x-y}In_yN$, where $0 \leq x < 1$, $0 \leq y < 1$, and $0 \leq x+y < 1$.

5. The process according to claim 1, wherein the gallium-containing nitride contains dopants of a donor and/or acceptor and/or magnetic type.

6. The process according to claim 1, wherein the seed has a crystalline layer of said gallium-containing nitride with a surface dislocation density $10^6/cm^2$ or less.

7. The process according to claim 1, wherein the crystallization of said gallium-containing nitride is carried out at a temperature from 100 to 800° C.

8. The process according to claim 1, wherein the crystallization of said gallium-containing nitride is carried out at a pressure from 100 to 10,000 bar.

9. The process according to claim 1, wherein the concentration of alkali metal ions in the supercritical solvent is controlled so as to provide adequate levels of solubility of the feedstock or the gallium-containing nitride.

10. The process according to claim 1, wherein the molar ratio of the alkali-metal ions to the remaining components in the supercritical solvent is controlled within the range of 1:200 to 1:2.

11. A process for obtaining a bulk monocrystalline gallium-containing nitride on the surface of heterogeneous substrate, which comprises the steps of dissolving gallium-containing feedstock in a supercritical solvent containing ammonia and alkali metal ion or ions in an autoclave, so as to form a supercritical solution containing gallium-containing nitride whose solubility has a negative temperature coefficient; and selectively crystallizing gallium-containing nitride crystal only on the face of a seed which contains no element of oxygen and has a lattice constant of 2.8 to 3.6 with respect to $a_o$-axis arranged in the autoclave, from the above supercritical solution introduced, by taking advantage of the negative temperature coefficient of the solubility of gallium-containing nitride.

12. A process for obtaining a bulk monocrystalline gallium-containing nitride, which comprises the steps of dissolving gallium-containing feedstock in a supercritical solvent containing ammonia and alkali metal ion or ions in an autoclave, so as to form a supercritical solution containing gallium-containing nitride whose solubility has a positive pressure coefficient; and selectively crystallizing gallium-containing nitride crystal only on the face of a seed which contains no element of oxygen and has a lattice constant of 2.8 to 3.6 with respect to $a_o$-axis arranged in the autoclave, from the above supercritical solution introduced, by taking advantage of the positive pressure coefficient of the solubility of gallium-containing nitride.

13. The process according to claim 11 or 12, wherein said seed has at least one layer containing at least one element or compound selected from Mo and W of body-centered cubic structure, α-Hf and α-Zr of hexagonal closest packing structure, diamond of tetragonal structure, WC and $W_2C$ of WC structure, SiC, TaN, NbN and AlN of ZnO structure, $AgB_2$, $AuB_2$ and $HfB_2$ of hexagonal structure (P6/mmm), and γ-MoC of hexagonal structure ($P6_3$/mmc) on the surface thereof.

14. The process according to claim 11 or 12, wherein the gallium-containing nitride is gallium nitride.

15. A process for crystallizing a bulk monocrystalline gallium-containing nitride comprising:
dissolving gallium-containing feedstock in a supercritical solvent containing ammonia and alkali metal ion or ions in an autoclave, so as to form a supercritical solution of gallium-containing nitride whose solubility has a negative temperature coefficient;
adjusting the supercritical solution below a certain concentration which does not allow spontaneous crystallization, while maintaining the oversaturation of the supercritical solution relative to a seed, by raising the temperature to a predetermined temperature or reducing the pressure to a predetermined pressure, at least in a zone where the seed having the seed phase which contains no element of oxygen and has a lattice constant of 2.8 to 3.6 with respect to $a_o$-axis is arranged; and
crystallizing gallium nitride to selectively grow only on the face of the seed arranged in the autoclave.

16. The process according to claim 15, wherein two zones, comprising a dissolution zone and a crystallization zone, are concurrently formed in the autoclave, and wherein the oversaturation of the supercritical solution relative to the seed is controlled by controlling the dissolution temperature and the crystallization temperature.

17. The process according to claim 15, wherein the temperature of the crystallization zone is set at a temperature from 400 to 600° C.

18. The process according to claim 15, wherein a difference in temperature between the two zones comprising the dissolution zone and the crystallization zone, concurrently formed in the autoclave, is maintained to 150° C. or less.

19. The process according to claim 15, wherein a specified difference in temperature is set between the dissolution zone and the crystallization zone, formed in the autoclave, and wherein the oversaturation of the supercritical solution relative to the seed having the seed phase which contains no element of oxygen and has a lattice constant of 2.8 to 3.6 with respect to $a_o$-axis is adjusted by utilizing gallium-containing feedstock which is introduced as GaN crystal having a total surface area larger than the total surface area of the seed.

* * * * *